(12) United States Patent
Uemichi

(10) Patent No.: US 12,052,007 B1
(45) Date of Patent: Jul. 30, 2024

(54) DIGITAL PHASE SHIFTER

(71) Applicant: Fujikura Ltd., Tokyo (JP)

(72) Inventor: Yusuke Uemichi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 18/018,332

(22) PCT Filed: Aug. 9, 2022

(86) PCT No.: PCT/JP2022/030380
§ 371 (c)(1),
(2) Date: Jan. 27, 2023

(87) PCT Pub. No.: WO2023/188448
PCT Pub. Date: Oct. 5, 2023

(30) Foreign Application Priority Data

Mar. 28, 2022 (JP) ................................. 2022-051668

(51) Int. Cl.
*H03H 11/16* (2006.01)
(52) U.S. Cl.
CPC .................................... *H03H 11/16* (2013.01)
(58) Field of Classification Search
CPC ..................................................... H03H 11/16
USPC ........................................................ 327/231
See application file for complete search history.

(56) References Cited

U.S. PATENT DOCUMENTS

2019/0157754 A1* 5/2019 Valdes Garcia ......... H04B 1/00
2019/0158068 A1* 5/2019 Valdes Garcia ..... H01Q 21/245

FOREIGN PATENT DOCUMENTS

| CN | 109616723 B | 7/2021 |
|---|---|---|
| JP | 7072118 B1 | 5/2022 |
| JP | 7076662 B1 | 5/2022 |
| JP | 7076663 B1 | 5/2022 |

OTHER PUBLICATIONS

Tousi et al., "A Ka-band Digitally-Controlled Phase Shifter with sub-degree Phase Precision", 2016 IEEE Radio Frequency Integrated Circuits Symposium, pp. 356-359, cited in Specification and ISR. (4 pages).
International Search Report dated Nov. 15, 2022, issued in counterpart Application No. PCT/JP2022/030380. (2 pages).

* cited by examiner

Primary Examiner — Tomi Skibinski
(74) Attorney, Agent, or Firm — WHDA, LLP

(57) ABSTRACT

A digital phase shifter in which a plurality of digital phase shift circuits are connected in cascade. One of the digital phase shift circuits includes at least a signal line, a pair of inner lines provided at both sides of the signal line, a pair of outer lines provided outside of the pair of inner lines, a first ground conductor connected to each first ends of the pair of inner lines and the pair of outer lines, a second ground conductor connected to each second ends of the pair of outer lines, and a pair of electronic switches provided between each of the second ends of the pair of inner lines and the second ground conductor. The pair of outer lines adjacent to each other are separated between the digital phase shift circuits adjacent to each other and the first ground conductor and the second ground conductor adjacent to each other are separated between the digital phase shift circuits adjacent to each other.

8 Claims, 9 Drawing Sheets

DIGITAL PHASE SHIFTER

TECHNICAL FIELD

The present invention relates to a digital phase shifter.

Priority is claimed on Japanese Patent Application No. 2022-051668, filed Mar. 28, 2022, the content of which is incorporated herein by reference.

BACKGROUND ART

In the following Non-Patent Document 1, a digitally controlled phase shift circuit (a digital phase shift circuit) targeting microwaves, submillimeter waves, or millimeter waves is disclosed. As shown in FIG. 2 of Non-Patent Document 1, this digital phase shift circuit includes a signal line, a pair of inner lines provided at both sides of the signal line, a pair of outer lines provided outside of the pair of inner lines, a first ground bar connected to each of the first ends of the pair of inner lines and the pair of outer lines, a second ground bar connected to each of the second ends of the pair of outer lines, a pair of N-channel metal-oxide semiconductor (NMOS) switches provided between each of the second ends of the pair of inner lines and the second ground bar, and the like.

This digital phase shift circuit switches the operation mode between a low delay mode and a high delay mode by switching a return current flowing through the pair of inner lines or the pair of outer lines due to the transmission of signal waves in the signal line in accordance with the opening/closing of the pair of NMOS switches. That is, in the digital phase shift circuit, the operation mode becomes the low delay mode when the return current flows through the pair of inner lines and the operation mode becomes the high delay mode when the return current flows through the pair of outer lines.

CITATION LIST

Non-Patent Document

[Non-Patent Document 1]
A Ka-band Digitally-Controlled Phase Shifter with Sub-degree Phase Precision (2016, IEEE, RFIC)

SUMMARY OF INVENTION

Technical Problem

The above-described digital phase shift circuit is applied to a base station of a 5th generation (5G) communication network using, for example, a phased array antenna or the like, and a large number of digital phase shift circuits are actually mounted on a semiconductor substrate in a state in which the digital phase shift circuits are connected in cascade. That is, the above-described digital phase shift circuit is a unit in the configuration of the actual phase shifter and constitutes a digital phase shifter that exhibits a desired function by connecting several tens of the digital phase shift circuits in cascade.

In this digital phase shifter, it is desirable to make a value of inductance (an inductance value), one of the circuit constants, during the high delay mode sufficiently larger than an inductance value during the low delay mode. However, a size of the digital phase shifter may increase when the inductance value is increased. As a result, it is difficult for a conventional digital phase shifter to sufficiently secure a difference between a phase shift amount in the low delay mode and a phase shift amount in the high delay mode particularly at low frequency.

The present invention has been made in view of the above-described circumstances and an objective of the present invention is to provide a digital phase shifter capable of increasing an inductance value during a high delay mode as compared with conventional technologies.

Solution to Problem

According to a first aspect of the present invention for achieving the above-described objective, there is provided a digital phase shifter in which a plurality of digital phase shift circuits are connected in cascade, one of the digital phase shift circuits including at least a signal line, a pair of inner lines provided at both sides of the signal line, a pair of outer lines provided outside of the pair of inner lines, a first ground conductor connected to each of first ends of the pair of inner lines and the pair of outer lines, a second ground conductor connected to each of second ends of the pair of outer lines, and a pair of electronic switches provided between each of second ends of the pair of inner lines and the second ground conductor, wherein the pair of outer lines adjacent to each other are separated in the digital phase shift circuits adjacent to each other and the first ground conductor and the second ground conductor adjacent to each other are separated in the digital phase shift circuits adjacent to each other.

In a digital phase shifter according to a second aspect of the present invention, in the above-described first aspect, the first ground conductor and the second ground conductor adjacent to each other are formed on a different conductive layer in the digital phase shift circuits adjacent to each other.

In a digital phase shifter according to a third aspect of the present invention, in the above-described second aspect, the pair of outer lines adjacent to each other are also formed on a different conductive layer in the digital phase shift circuits adjacent to each other.

In a digital phase shifter according to a fourth aspect of the present invention, in any one of the above-described first to third aspects, distances from the signal line to the pair of outer lines are different in the digital phase shift circuits adjacent to each other.

In a digital phase shifter according to a fifth aspect of the present invention, in any one of the above-described first to third aspects, one of the pair of outer lines is deleted such that a positional relationship of the pair of outer lines with respect to the signal line is reversed in the digital phase shift circuits adjacent to each other.

In a digital phase shifter according to a sixth aspect of the present invention, in any one of the above-described first to third aspects, one of the digital phase shift circuits adjacent to each other includes the pair of outer lines obtained by connecting a plurality of individual lines having different distances from the signal line.

In a digital phase shifter according to a seventh aspect of the present invention, in any one of the above-described first to sixth aspects, the digital phase shift circuit includes a capacitor having an upper electrode connected to the signal line and a lower electrode connected to at least one of the first ground conductor and the second ground conductor.

In a digital phase shifter according to an eighth aspect of the present invention, in the above-described seventh aspect, the digital phase shift circuit further includes an electronic switch for a capacitor between the lower electrode of the capacitor and at least one of the first ground conductor and the second ground conductor.

Advantageous Effects of Invention

According to the above-described aspects of the present invention, it is possible to provide a digital phase shifter capable of increasing an inductance value during a high delay mode as compared with conventional technologies.

DESCRIPTION OF EMBODIMENTS

Hereinafter, embodiments of the present invention will be described with reference to the drawings.

First Embodiment

First, a first embodiment of the present invention will be described. A digital phase shifter A1 according to the first embodiment is a high-frequency circuit that inputs high-frequency signals such as microwaves, submillimeter waves, or millimeter waves, and the like and outputs to the outside a plurality of high-frequency signals that are phase-shifted by a predetermined amount.

Figure 1:
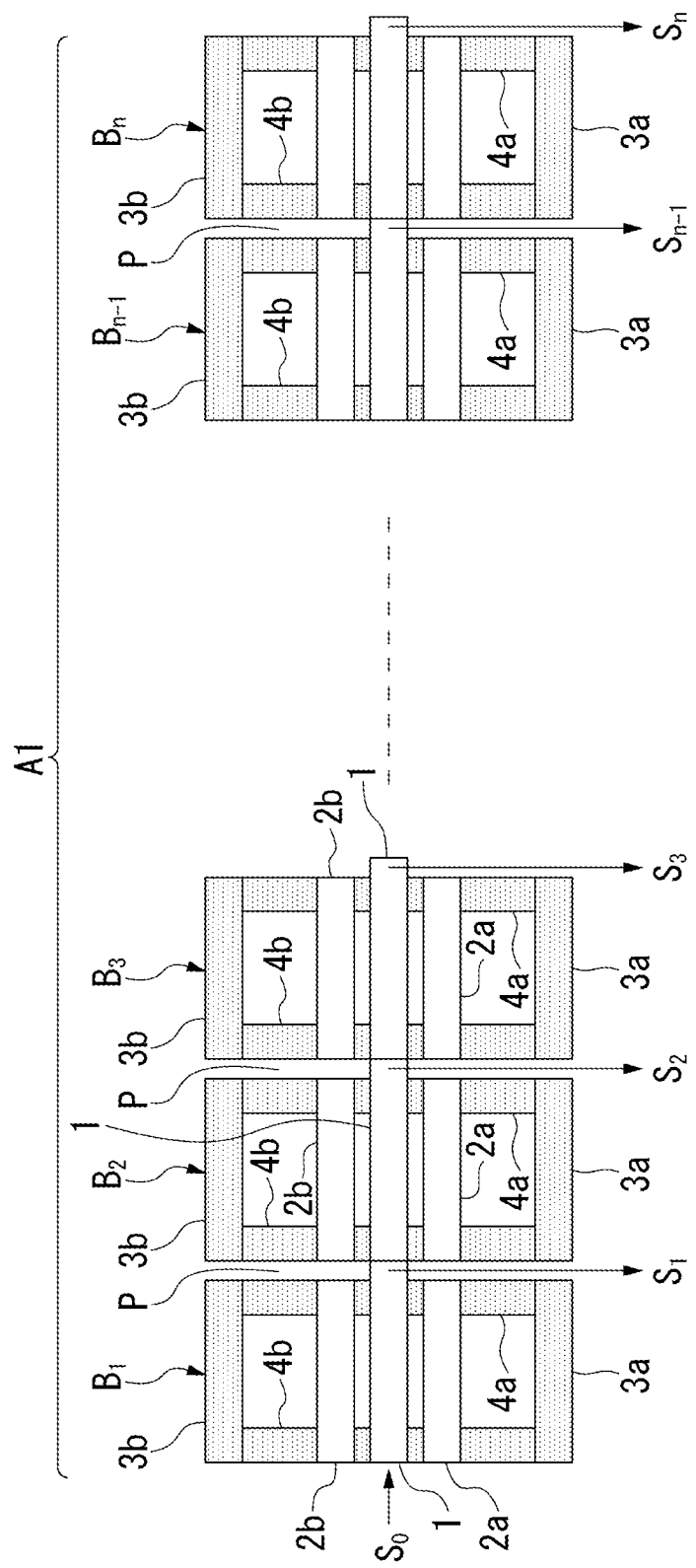
FIG. 1 is a front view showing a configuration of a digital phase shifter A1 according to a first embodiment of the present invention.

As shown in FIG. 1, the digital phase shifter A1 is obtained by connecting n (two or more) digital phase shift circuits B1 to Bn in cascade. That is, the digital phase shifter A1 is configured by linearly connecting a first digital phase shift circuit B1, a second digital phase shift circuit B2, . . . , and an nth digital phase shift circuit Bn in cascade. The digital phase shifter A1 outputs to the outside high-frequency signals from the first digital phase shift circuit B1 or the nth digital phase shift circuit Bn.

Here, the first to nth digital phase shift circuits B1 to Bn are units constituting the digital phase shifter A1. The first to nth digital phase shift circuits B1 to Bn are linearly connected in cascade and have a relationship in which they are adjacent to each other.

The first to nth digital phase shift circuits B1 to Bn have substantially similar functions to the digitally controlled phase shift circuit disclosed in Non-Patent Document 1.

Figure 2:
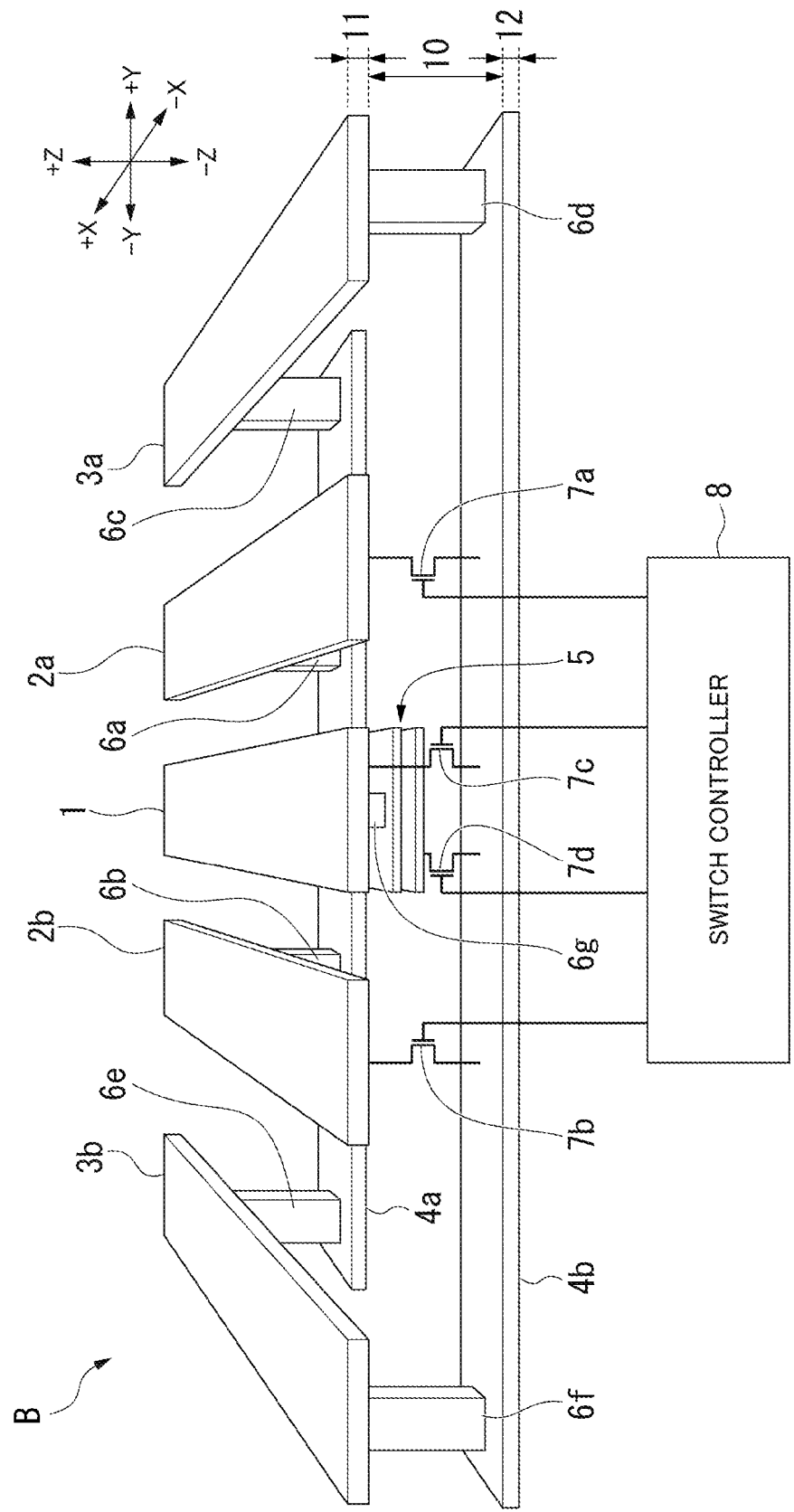
FIG. 2 is a conceptual diagram showing a functional configuration of a basic digital phase shift circuit B in the embodiment of the present invention.

That is, the first to nth digital phase shift circuits B1 to Bn each include a signal line 1, a pair of inner lines 2a and 2b, a pair of outer lines 3a and 3b, a pair of ground conductors 4a and 4b, a capacitor 5, seven connection conductors 6a to 6g, four electronic switches 7a to 7d, and a switch controller 8 as denoted by representative reference sign B in FIG. 2. Hereinafter, the first to nth digital phase shift circuits B1 to Bn are collectively referred to as the basic digital phase shift circuit B.

The signal line 1 is a linear band-shaped conductor extending in a predetermined direction as shown in FIG. 2. That is, the signal line 1 is a long plate-shaped conductor having a certain width, a certain thickness, and a predetermined length. In the signal line 1, a signal current flows from the front side to the back side, i.e., from an end of the front side (an input end) to an end of the back side (an output end). This signal current is a high-frequency signal having the above-described microwave, submillimeter wave, or millimeter wave wavelength range.

This signal line 1 electrically has inductance L1 as a distributed circuit constant. The inductance L1 is parasitic inductance having a magnitude corresponding to a shape of the signal line 1, such as the length of the signal line 1, and the like. Also, the signal line 1 electrically has capacitance C1 as a distributed circuit constant. The capacitance C1 is parasitic capacitance between the signal line 1 and the pair of inner lines 2a and 2b or between the signal line 1 and the pair of outer lines 3a and 3b or parasitic capacitance between silicon substrates (not shown) in which the digital phase shift circuits B1 to Bn are installed.

The pair of inner lines 2a and 2b are linear band-shaped conductors provided at both sides of the signal line 1. In the pair of inner lines 2a and 2b, the first inner line 2a is spaced apart at one side of the signal line 1 (the right side in FIG. 2) and is a long plate-shaped conductor having a certain width, a certain thickness, and a predetermined length. That is, the first inner line 2a is provided parallel to the signal line 1 at an interval of a predetermined distance and extends in a direction that is the same as an extension direction of the signal line 1.

The second inner line 2b is spaced apart at the other side of the signal line 1 (the left side in FIG. 2) and is a long plate-shaped conductor having a certain width, a certain thickness, and a predetermined length like the first inner line 2a. The second inner line 2b is provided parallel to the signal line 1 at an interval of a distance similar to the distance between the signal line 1 and the first inner line 2a and extends in a direction that is the same as an extension direction of the signal line 1 like the first inner line 2a.

The first outer line 3a is a linear band-shaped conductor provided outside of the first inner line 2a at the one side of the signal line 1. That is, the first outer line 3a is a long plate-shaped conductor having a certain width, a certain thickness, and a predetermined length and is provided at a position farther from the signal line 1 than the first inner line 2a at the one side of the signal line 1.

Also, the first outer line 3a is provided parallel to the signal line 1 at an interval of a predetermined distance from the signal line 1 in a state in which the first inner line 2a is sandwiched as shown in the drawing. That is, the first outer line 3a extends in a direction that is the same as the extension direction of the signal line 1 like the first inner line 2a and the second inner line 2b.

The second outer line 3b is a linear band-shaped conductor provided outside of the second inner line 2b at the other side of the signal line 1, i.e., the side different from (opposite to) the side of the first outer line 3a. That is, the second outer line 3b is a long plate-shaped conductor having a certain width, a certain thickness, and a predetermined length and is provided at a position farther from the signal line 1 than the second inner line 2b at the other side of the signal line 1.

Also, the second outer line 3b is provided parallel to the signal line 1 at an interval of a predetermined distance from the signal line 1 in a state in which the second inner line 2b is sandwiched as shown in the drawing. That is, the second outer line 3b extends in a direction that is the same as the extension direction of the signal line 1 like the first inner line 2a, the second inner line 2b, and the first outer line 3a.

The first ground conductor 4a is a linear band-shaped conductor provided at each of first end sides of the first inner line 2a, the second inner line 2b, the first outer line 3a, and the second outer line 3b. That is, the first ground conductor 4a is a long plate-shaped conductor having a certain width, a certain thickness, and a predetermined length, and is electrically grounded.

Also, the first ground conductor 4a is provided orthogonal to the first inner line 2a, the second inner line 2b, the first outer line 3a, and the second outer line 3b extending in the same direction. That is, the first ground conductor 4a is provided to extend in the left and right directions at each of the first end sides of the first inner line 2a, the second inner line 2b, the first outer line 3a, and the second outer line 3b.

Furthermore, the first ground conductor 4a is provided downward at an interval of a predetermined distance from the first inner line 2a, the second inner line 2b, the first outer line 3a, and the second outer line 3b. That is, a certain distance is provided in the upward/downward direction between the first ground conductor 4a and each ends of the first end sides of the first inner line 2a, the second inner line 2b, the first outer line 3a, and the second outer line 3b.

Here, the length of the first ground conductor 4a is set such that the first end in the left and right directions (the right end in FIG. 2) has substantially the same position as the right edge portion of the first outer line 3a. Also, the length of the first ground conductor 4a is set such that the second end in the left and right directions (the left end in FIG. 2) has substantially the same position as the left edge portion of the second outer line 3b.

The second ground conductor 4b is a linear band-shaped conductor provided at each of the second end sides of the first inner line 2a, the second inner line 2b, the first outer line 3a, and the second outer line 3b. That is, the second ground conductor 4b is a long plate-shaped conductor having a certain width, a certain thickness, and a predetermined length and is electrically grounded.

Also, the second ground conductor 4b is provided orthogonal to the first inner line 2a, the second inner line 2b, the first outer line 3a, and the second outer line 3b extending in the same direction. That is, the second ground conductor 4b extends in the left and right directions at each of the second end sides of the first inner line 2a, the second inner line 2b, the first outer line 3a, and the second outer line 3b.

Further, the second ground conductor 4b is provided downward at an interval of a predetermined distance from the first inner line 2a, the second inner line 2b, the first outer line 3a, and the second outer line 3b. That is, a certain distance is provided in the upward/downward direction between the second ground conductor 4b and each ends of second end sides of the first inner line 2a, the second inner line 2b, the first outer line 3a, and the second outer line 3b.

Here, the length of the second ground conductor 4b is set such that the first end in the left and right directions (the right end in FIG. 2) has substantially the same position as the right edge portion of the first outer line 3a. Also, the length of the second ground conductor 4b is set such that the second end in the left and right directions (the left end in FIG. 2) has substantially the same position as the left edge portion of the second outer line 3b. That is, the position of the second ground conductor 4b is the same as the position of the first ground conductor 4a in the left and right directions.

The capacitor 5 is parallel plates in which the upper electrode is connected to the signal line 1 via the seventh connection conductor 6g and the lower electrode is connected to the second ground conductor 4b via the fourth electronic switch 7d. The capacitor 5 has capacitance Ca corresponding to an opposing area of the parallel plates. That is, the capacitance Ca has a circuit constant provided between the signal line 1 and the second ground conductor 4b. Also, the lower electrode of the capacitor may be connected to the first ground conductor 4a via the fourth electronic switch 7d. Also, the lower electrode of the capacitor may be connected to the first ground conductor 4a and the second ground conductor 4b via the fourth electronic switch 7d.

The first connection conductor 6a is a conductor that electrically and mechanically connects the first end of the first inner line 2a and the first ground conductor 4a. That is, the first connection conductor 6a is a conductor extending in the upward/downward direction and has the first end (an upper end) connected to the lower surface at the first end of the first inner line 2a and the second end (a lower end) connected to the upper surface of the first ground conductor 4a.

The second connection conductor 6b is a conductor that electrically and mechanically connects the first end of the second inner line 2b and the first ground conductor 4a. That is, the second connection conductor 6b is a conductor extending in the upward/downward direction like the first connection conductor 6a and has the first end (an upper end) connected to the lower surface at the first end of the second inner line 2b and the second end (a lower end) connected to the upper surface of the first ground conductor 4a.

The third connection conductor 6c is a conductor that electrically and mechanically connects the first end of the first outer line 3a and the first ground conductor 4a. That is, the third connection conductor 6c is a conductor extending in the upward/downward direction and has the first end (an upper end) connected to the lower surface at the first end of the first outer line 3a and the second end (a lower end) connected to the upper surface of the first ground conductor 4a.

The fourth connection conductor 6d is a conductor that electrically and mechanically connects the second end of the first outer line 3a and the second ground conductor 4b. That is, the fourth connection conductor 6d is a conductor extending in the upward/downward direction and has the first end (an upper end) connected to the lower surface at the second end of the first outer line 3a and the second end (a lower end) connected to the upper surface of the second ground conductor 4b.

The fifth connection conductor 6e is a conductor that electrically and mechanically connects the first end of the second outer line 3b and the first ground conductor 4a. That is, the fifth connection conductor 6e is a conductor extending in the upward/downward direction and has the first end (an upper end) connected to the lower surface at the first end of the second outer line 3*b* and the second end (a lower end) connected to the upper surface of the first ground conductor 4*a*.

The sixth connection conductor 6*f* is a conductor that electrically and mechanically connects the second end of the second outer line 3*b* and the second ground conductor 4*b*. That is, the sixth connection conductor 6*f* is a conductor extending in the upward/downward direction and has the first end (an upper end) connected to the lower surface at the second end of the second outer line 3*b* and the second end (a lower end) connected to the upper surface of the second ground conductor 4*b*.

The seventh connection conductor 6*g* is a conductor that electrically and mechanically connects the signal line 1 and the upper electrode of the capacitor 5. That is, the seventh connection conductor 6*g* is a conductor extending in the upward/downward direction and has the first end (an upper end) connected to the lower surface of the signal line 1 and the second end (a lower end) connected to the upper surface of the upper electrode of the capacitor 5.

The first electronic switch 7*a* is a transistor that connects the second end of the first inner line 2*a* to the second ground conductor 4*b* such that it is freely opened and closed. The first electronic switch 7*a* is, for example, a MOS-type FET as shown in the drawing, and has a drain terminal connected to the lower surface at the second end of the first inner line 2*a*, a source terminal connected to the upper surface of the second ground conductor 4*b*, and a gate terminal connected to the switch controller 8.

The first electronic switch 7*a* switches the conductive state between the drain terminal and the source terminal to an open state or a closed state on the basis of a gate signal input from the switch controller 8 to the gate terminal. That is, the first electronic switch 7*a* turns ON/OFF a connection between the second end of the first inner line 2*a* and the second ground conductor 4*b* through the switch controller 8.

The second electronic switch 7*b* is a transistor that connects the second end of the second inner line 2*b* and the second ground conductor 4*b* such that it is freely opened and closed. The second electronic switch 7*b* is a MOS-type FET like the first electronic switch 7*a* and has a drain terminal connected to the lower surface at the second end of the second inner line 2*b*, a source terminal connected to the upper surface of the second ground conductor 4*b*, and a gate terminal connected to the switch controller 8.

The second electronic switch 7*b* switches a conductive state between the drain terminal and the source terminal to an open state or a closed state on the basis of a gate signal input from the switch controller 8 to the gate terminal. That is, the second electronic switch 7*b* turns ON/OFF a connection between the second end of the second inner line 2*b* and the second ground conductor 4*b* through the switch controller 8.

The third electronic switch 7*c* is a transistor that connects the first end of the signal line 1 and the first ground conductor 4*a* such that it is freely opened and closed. The third electronic switch 7*c* is a MOS-type FET like the first electronic switch 7*a* and the second electronic switch 7*b* described above and has a drain terminal connected to the lower surface at the first end of the signal line 1, a source terminal connected to the upper surface of the first ground conductor 4*a*, and a gate terminal connected to the switch controller 8. Also, the third electronic switch 7*c* may be provided between the lower surface at the second end of the signal line 1 and the upper surface of the second ground conductor 4*b* instead of between the lower surface at the first end of the signal line 1 and the upper surface of the first ground conductor 4*a* (see FIG. 2).

This third electronic switch 7*c* switches the conductive state between the drain terminal and the source terminal to an open state or a closed state on the basis of a gate signal input from the switch controller 8 to the gate terminal. That is, the third electronic switch 7*c* turns ON/OFF a connection between the first end of the signal line 1 and the first ground conductor 4*a* through the switch controller 8.

The fourth electronic switch 7*d* is a transistor that connects the lower electrode of the capacitor 5 and the second ground conductor 4*b* such that it is freely opened and closed. The fourth electronic switch 7*d* is a MOS-type FET like the first electronic switch 7*a*, the second electronic switch 7*b*, and the third electronic switch 7*c* described above, and has a drain terminal connected to the lower surface of the lower electrode of the capacitor 5, a source terminal connected to the upper surface of the second ground conductor 4*b*, and a gate terminal connected to the switch controller 8.

This fourth electronic switch 7*d* switches the conductive state between the drain terminal and the source terminal to an open state or a closed state on the basis of a gate signal input from the switch controller 8 to the gate terminal. That is, the fourth electronic switch 7*d* turns ON/OFF a connection between the lower electrode of the capacitor 5 and the second ground conductor 4*b* through the switch controller 8. Also, the fourth electronic switch 7*d* corresponds to the electronic switch for the capacitor of the present embodiment. Also, when the lower electrode of the capacitor 5 is connected to the first ground conductor 4*a* via the fourth electronic switch 7*d*, the fourth electronic switch 7*d* turns ON/OFF a connection between the lower electrode of the capacitor 5 and the first ground conductor 4*a* through the switch controller 8. Also, when the lower electrode of the capacitor 5 is connected to the first ground conductor 4*a* and the second ground conductor 4*b* via the electronic switch 7*d*, the fourth electronic switch 7*d* turns ON/OFF a connection between the lower electrode of the capacitor 5 and the first ground conductor 4*a* through the switch controller 8 and the fourth electronic switch 7*d* turns ON/OFF a connection between the lower electrode of the capacitor 5 and the second ground conductor 4*b* through the switch controller 8.

The switch controller 8 is a control circuit that controls the first electronic switch 7*a*, the second electronic switch 7*b*, the third electronic switch 7*c*, and the fourth electronic switch 7*d* described above. The switch controller 8 includes four output ports and individually outputs gate signals from the output ports to the gate terminals of the first electronic switch 7*a*, the second electronic switch 7*b*, the third electronic switch 7*c*, and the fourth electronic switch 7*d*. That is, the switch controller 8 controls the ON/OFF operations of the first electronic switch 7*a*, the second electronic switch 7*b*, the third electronic switch 7*c*, and the fourth electronic switch 7*d* through the above-described gate signals.

Here, a schematic diagram in which the basic digital phase shift circuit B is obliquely viewed such that the mechanical structure of the basic digital phase shift circuit B (i.e., the first to nth digital phase shift circuits B1 to Bn) is easily understood is shown in FIG. 2, but the actual basic digital phase shift circuit B is formed as a laminate structure in which two or more conductive layers between which the insulating layer 10 is sandwiched are laminated using semiconductor manufacturing technology.

For example, in the basic digital phase shift circuit B, the signal line 1, the first inner line 2*a*, the second inner line 2*b*, the first outer line 3*a*, and the second outer line 3*b* are formed in the first conductive layer 11, and the first ground conductor 4a and the second ground conductor 4b are formed in the second conductive layer 12 opposing the first conductive layer 11 in a state in which the insulating layer 10 is sandwiched between the first conductive layer 11 and the second conductive layer 12.

The component of the first conductive layer 11, the component of the second conductive layer 12, the capacitor 5, and the first to fourth electronic switches 7a to 7d are connected through vias (through holes). That is, these vias are buried inside of the insulating layer 10 and function as the first connection conductor 6a, the second connection conductor 6b, the third connection conductor 6c, the fourth connection conductor 6d, the fifth connection conductor 6e, the sixth connection conductor 6f, and the seventh connection conductor 6g described above.

As shown in FIG. 1, the digital phase shifter A1 including basic digital phase shift circuits B (the first to nth digital phase shift circuits B1 to Bn) has a structure in which a plurality of digital phase shift circuits B1 to Bn are arranged such that the first ground conductor 4a and the second ground conductor 4b face each other at an interval of a predetermined distance. That is, in the digital phase shifter A1 according to the first embodiment, a gap P is formed between the first ground conductor 4a and the second ground conductor 4b in a facing relationship in the digital phase shift circuits adjacent to each other.

Next, an operation of the digital phase shifter A1 according to the first embodiment will be described in detail.

In the basic digital phase shift circuit B, the operating mode is switched in accordance with conductive states of the first, second, and fourth electronic switches 7a, 7b, and 7d. That is, the operation modes of the basic digital phase shift circuit B include a low delay mode in which only the states of the first electronic switch 7a and the second electronic switch 7b are set as the ON state by the switch controller 8 and a high delay mode in which only the state of the fourth electronic switch 7d is set as the ON state by the switch controller 8.

In the low delay mode, the switch controller 8 sets the states of the first electronic switch 7a and the second electronic switch 7b as the ON state and sets the fourth electronic switch 7d as the OFF state. That is, in the low delay mode, a first phase difference θL less than a second phase difference θH in the high delay mode is caused by a first propagation delay time TL until the high-frequency signal propagates from the input end (the second end) of the signal line 1 to the output end (the first end) thereof.

This low delay mode will be described in more detail. The first inner line 2a is in a state in which the second end thereof is connected to the second ground conductor 4b by setting the state of the first electronic switch 7a as the ON state. That is, the first inner line 2a forms a first current-carrying path along which an electric current can flow between the first end and the second end of the first inner line 2a by connecting the first end of the first inner line 2a to the first ground conductor 4a via the first connection conductor 6a all the time and connecting the second end of the first inner line 2a to the second ground conductor 4b via the first electronic switch 7a.

On the other hand, the second inner line 2b is in a state in which the second end thereof is connected to the second ground conductor 4b by setting the state of the second electronic switch 7b as the ON state. That is, the second inner line 2b forms a second current-carrying path along which an electric current can flow between the first end and the second end of the second inner line 2b by connecting the first end of the second inner line 2b to the first ground conductor 4a via the second connection conductor 6b all the time and connecting the second end of the second inner line 2b to the second ground conductor 4b via the second electronic switch 7b.

Also, when a signal current flows from the input end to the output end through the signal line 1 in a state in which both ends of the first inner line 2a and the second inner line 2b are connected to the first ground conductor 4a and the second ground conductor 4b, a return current of the signal current from the first end to the second end flows through the first inner line 2a and the second inner line 2b due to the propagation of the signal current.

That is, a first return current flows through the first inner line 2a forming the first current-carrying path in a direction opposite to a current-carrying direction of the signal current in a current-carrying process for the signal current in the signal line 1. Also, a second return current flows through the second inner line 2b forming the second current-carrying path in a direction opposite to a current-carrying direction of the signal current in a current-carrying process for the signal current in the signal line 1, i.e., a direction that is the same as a direction of the first return current.

Here, both the first return current flowing through the first inner line 2a and the second return current flowing through the second inner line 2b are in a direction opposite to a current-carrying direction of the signal current. Therefore, the first return current and the second return current act to reduce inductance L1 of the signal line 1 due to electromagnetic coupling between the signal line 1 and the first inner line 2a and the second inner line 2b. When a reduced amount of the inductance L1 is $\Delta Ls$, the effective inductance Lm of the signal line 1 is (L1−$\Delta Ls$).

Also, the signal line 1 has capacitance C1 as parasitic capacitance as described above. In the low delay mode, because the state of the fourth electronic switch 7d is set as the OFF state, the capacitor 5 is not connected between the signal line 1 and the second ground conductor 4b. That is, the capacitance Ca of the capacitor 5 does not affect the high-frequency signal propagating through the signal line 1. Therefore, the first propagation delay time TL proportional to $(Lm \times C1)^{1/2}$ acts on the high-frequency signal propagating through the signal line 1.

Also, the high-frequency signal at the output end (the first end) of the signal line 1 becomes a signal obtained by delaying a phase of a high-frequency signal at the input end (the second end) of the signal line 1 by a first phase difference θL due to the first propagation delay time TL. That is, in the low delay mode, the inductance L1 of the signal line 1 is reduced to the inductance Lm by the first return current and the second return current and therefore the original propagation delay time of the signal line 1 is reduced. As a result, the first phase difference θL smaller than the original phase difference of the signal line 1 is realized.

Here, in the low delay mode, the loss of the signal line 1 is intentionally increased by setting the state of the third electronic switch 7c as the ON state. The purpose of the loss imposition is to bring the output amplitude of the high-frequency signal in the low delay mode close to the output amplitude in the high delay mode.

That is, the loss of the high-frequency signal in the low delay mode is clearly less than the loss of the high-frequency signal in the high delay mode. This loss difference causes an amplitude difference of the high-frequency signal output from the basic digital phase shift circuit B when the operation mode is switched between the low delay mode and the high delay mode. In this situation, in the basic digital phase shift circuit B, the above-described amplitude difference is eliminated by setting the state of the third electronic switch 7c as the ON state in the low delay mode.

On the other hand, in the high delay mode, the switch controller 8 sets the states of the first electronic switch 7a, the second electronic switch 7b, and the third electronic switch 7c as the OFF state and sets the fourth electronic switch 7d as the ON state. That is, in the high delay mode, a second phase difference θH larger than the first phase difference θL in the low delay mode is caused by a second propagation delay time TH until the high-frequency signal propagates from the input end (the second end) of the signal line 1 to the output end (the first end) thereof.

In this high delay mode, because the states of the first electronic switch 7a and the second electronic switch 7b are set as the OFF state, the first current-carrying path is not formed on the first inner line 2a and the second current-carrying path is not formed on the second inner line 2b. Therefore, the first return current flowing through the first inner line 2a becomes significantly small and the second return current flowing through the second inner line 2b becomes significantly small.

On the other hand, the first outer line 3a has the first end connected to the first ground conductor 4a via the third connection conductor 6c and the second end connected to the second ground conductor 4b via the fourth connection conductor 6d. That is, a third current-carrying path along which an electric current can flow between the first end and the second end of the first outer line 3a is formed in advance in the first outer line 3a. Therefore, in the high delay mode, a third return current flows from the first end of the first outer line 3a to the second end thereof due to the signal current in the signal line 1. This third return current is in a direction opposite to the current-carrying direction of the signal current in the signal line 1. Therefore, the third return current can reduce the inductance L1 of the signal line 1 due to electromagnetic coupling between the signal line 1 and the first outer line 3a.

Also, the second outer line 3b has the first end connected to the first ground conductor 4a via the fifth connection conductor 6e and the second end connected to the second ground conductor 4b via the sixth connection conductor 6f. That is, a fourth current-carrying path along which an electric current can flow between the first end and the second end of the second outer line 3b is formed in advance in the second outer line 3b. Therefore, in the high delay mode, a fourth return current flows from the first end of the second outer line 3b to the second end thereof due to the signal current in the signal line 1. This fourth return current is in a direction opposite to the current-carrying direction of the signal current in the signal line 1. Therefore, the fourth return current can reduce the inductance L1 of the signal line 1 due to electromagnetic coupling between the signal line 1 and the second outer line 3b.

Here, distances between the signal line 1 and the first outer line 3a and the second outer line 3b are greater than distances between the signal line 1 and the first inner line 2a and the second inner line 2b. Therefore, the third return current and the fourth return current have a smaller effect of reducing the inductance L1 than the first return current and the second return current. When the reduced amount of the inductance L1 due to the third return current and the fourth return current is ΔLh, the effective inductance Lp of the signal line 1 is (L1−ΔLh).

On the other hand, the signal line 1 has capacitance C1 as parasitic capacitance. Also, in the high delay mode, because the state of the fourth electronic switch 7d is set as the ON state, the capacitor 5 is connected between the signal line 1 and the second ground conductor 4b. That is, the signal line 1 has capacitance Cb obtained by adding the capacitance Ca of the capacitor 5 and the capacitance C1 (parasitic capacitance). Therefore, the second propagation delay time TH proportional to $(Lp \times Cb)^{1/2}$ acts on the high-frequency signal propagating through the signal line 1.

Also, the high-frequency signal at the output end of the signal line 1 becomes a signal obtained by delaying a phase of the high-frequency signal at the input end of the signal line 1 by the second phase difference θH due to this second propagation delay time TH. That is, in the high delay mode, the second phase difference θH greater than the first phase difference θL of the low delay mode is realized by weakly reducing the inductance L1 of the signal line 1 to the inductance Ln using the third and fourth return currents and setting the state of the fourth electronic switch 7d as the ON state.

Also, in the high delay mode, the state of the third electronic switch 7c is set as the OFF state. That is, in the high delay mode, no action is taken to intentionally increase the loss of the signal line 1. As a result, the output amplitude of the high-frequency signal in the high delay mode approaches the output amplitude in the low delay mode.

In this digital phase shifter A1 according to the first embodiment, in the digital phase shift circuits connected in cascade in a linear shape and adjacent to each other, the outer line 3a and the outer line 3a adjacent to each other face each other with a gap P therebetween and the second outer line 3b and the second outer line 3b adjacent to each other face each other with a gap P therebetween. Also, in this digital phase shift circuit B1, the first ground conductor 4a and the second ground conductor 4b adjacent to each other are arranged with a gap P therebetween.

That is, in the digital phase shift circuit B1, the two first outer lines 3a and 3a adjacent to each other and the two second outer lines 3b and 3b adjacent to each other are arranged with a gap S without direct contact. Also, the first ground conductor 4a and the second ground conductor 4b adjacent to each other are arranged having a gap S without direct contact.

For example, focusing on the first digital phase shift circuit B1, the second digital phase shift circuit B2, and the third digital phase shift circuit B3 shown in FIG. 1, the first outer line 3a in the first digital phase shift circuit B1 and the first outer line 3a in the second digital phase shift circuit B2 is adjacent to each other. Also, the second outer line 3b in the first digital phase shift circuit B1 and the second outer line 3b in the second digital phase shift circuit B2 are adjacent to each other.

Furthermore, the first ground conductor 4a of the first digital phase shift circuit B1 and the second ground conductor 4b of the second digital phase shift circuit B2 are adjacent to each other. For the first digital phase shift circuit B1 and the second digital phase shift circuit B2, the two first outer lines 3a and 3a, the two second outer lines 3b and 3b, and the first ground conductor 4a and the second ground conductor 4b are arranged with a gap S without contact.

Also, the first outer line 3a in the second digital phase shift circuit B2 and the first outer line 3a in the third digital phase shift circuit B3 are adjacent to each other. Also, the second outer line 3b in the second digital phase shift circuit B2 and the second outer line 3b in the third digital phase shift circuit B3 are adjacent to each other.

Furthermore, the first ground conductor 4a of the second digital phase shift circuit B2 and the second ground conductor 4b of the third digital phase shift circuit B3 are adjacent to each other. For the second digital phase shift circuit B2 and the third digital phase shift circuit B3, the two first outer lines 3a and 3a, the two second outer lines 3b and 3b, and the first ground conductor 4a and the second ground conductor 4b are arranged with a gap S without contact.

In this digital phase shifter A1, because the two first outer lines 3a and 3a, the two second outer lines 3b and 3b, and the first ground conductor 4a and the second ground conductor 4b adjacent to each other are located without direct contact, a total net return path (a sum of 4b, 3b, and 4b) per unit during high delay can be lengthened and the inductance value can be increased. In the case of direct contact, return currents in opposite directions flowing through the adjacent second ground conductors 4b during high delay cancel each other out and the net return path length of the second ground conductors 4b becomes 0 (zero).

Therefore, according to the first embodiment, it is possible to provide a digital phase shifter A1 capable of increasing the inductance value during the high delay mode as compared with conventional technologies. Therefore, according to the first embodiment, it is possible to increase a difference between the phase shift amount during the high delay mode and the phase shift amount during the low delay mode as compared with conventional technologies.

Figure 3:
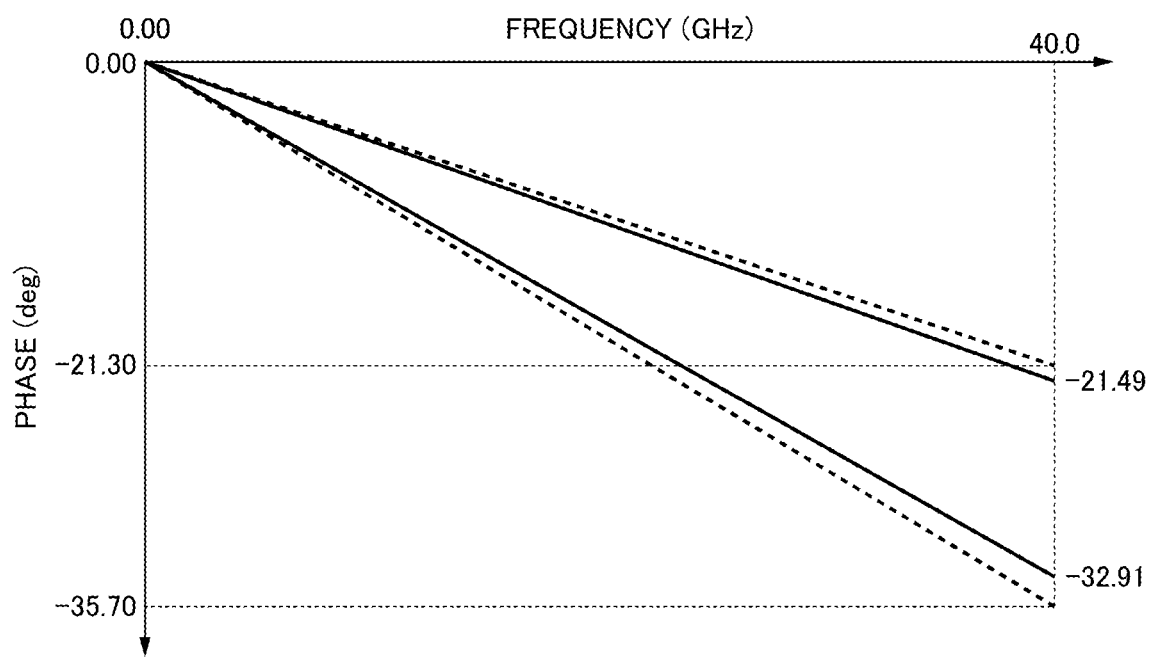
FIG. 3 is a graph showing phase transition characteristics of the digital phase shifter A1 according to the first embodiment of the present invention.

Here, the solid lines in FIG. 3 are a graph showing the phase shift characteristics of the digital phase shifter A1 according to the first embodiment. As shown in FIG. 3, the digital phase shifter A1 according to the first embodiment can ensure a large phase shift amount as the frequency increases. Also, the digital phase shifter A1 according to the first embodiment can sufficiently ensure a difference between the phase shift amount during the high delay mode and the phase shift amount during the low delay mode.

Also, the dotted lines in FIG. 3 are shown as comparative examples and are phase shift characteristics when the conductive layer is changed. That is, the dotted line indicates a phase shift characteristic when the first ground conductor 4a is formed in a layer different from that of the second ground conductor 4b and the phase shift amount during the high delay mode can be further increased than that indicated by the solid line.

Second Embodiment

Figure 4:
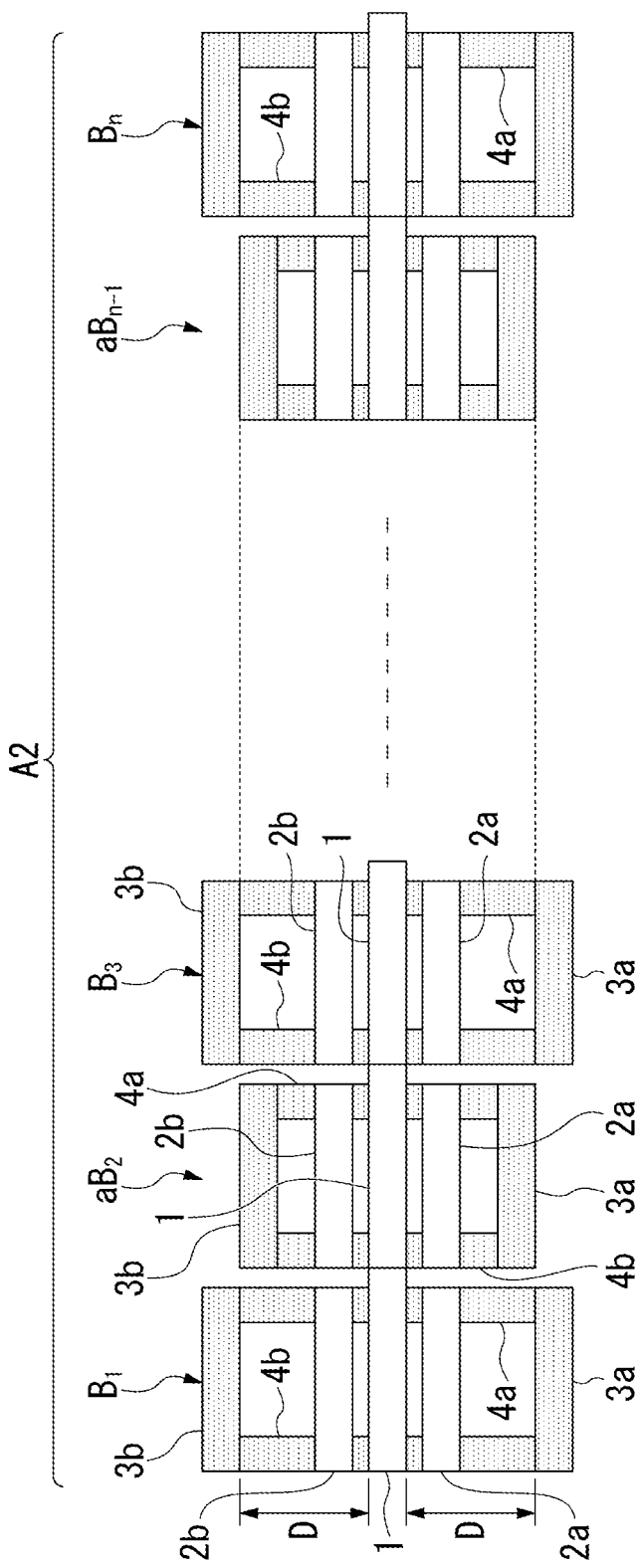
FIG. 4 is a front view showing a configuration of a digital phase shifter A2 according to a second embodiment of the present invention.

Next, a second embodiment of the present invention will be described with reference to FIG. 4. As shown in FIG. 4, in the digital phase shifter A2 according to the second embodiment, distances between the signal line 1 and the first outer line 3a are different between the digital phase shift circuits adjacent to each other, and distances between the signal line 1 and the second outer line 3b are different between the digital phase shift circuits adjacent to each other. In other words, the distances from the signal line 1 to the first outer line 3a and the second outer line 3b are different between the digital phase shift circuits adjacent to each other. That is, the distances from the signal line 1 to a pair of outer lines (the first outer line 3a and the second outer line 3b) are different between the digital phase shift circuits adjacent to each other.

In the digital phase shifter A1 according to the first embodiment, the distances from the signal line 1 to the first outer line 3a and the second outer line 3b are the same between the digital phase shift circuits adjacent to each other as shown in FIG. 1. On the other hand, a first modified digital phase shift circuit aB, in which the distances from the signal line 1 to the first outer line 3a and the second outer line 3b are different from those in the basic digital phase shift circuit B, is adopted in the digital phase shifter A2 according to the second embodiment and the basic digital phase shift circuit B and the first modified digital phase shift circuit aB are alternately arranged.

That is, in the digital phase shifter A2 according to the second embodiment, the basic digital phase circuit B is adopted in a first digital phase shift circuit B1, a third digital phase shift circuit B3, . . . , and an nth digital phase shift circuit Bn as shown in FIG. 4.

Also, in the digital phase shifter A2, the first modified digital phase shift circuit aB different from the basic digital phase shift circuit B in positions of the first outer line 3a and the second outer line 3b with respect to the signal line 1 is adopted in a second digital phase shift circuit B2, . . . , and an (n−1)th digital phase shift circuit Bn−1.

More specifically, as shown in FIG. 4, the positions of the first outer line 3a and the second outer line 3b in the first modified digital phase shift circuit aB are closer to the signal line 1 than the positions of the first outer line 3a and the second outer line 3b in the basic digital phase shift circuit B. That is, the lengths of the first ground conductor 4a and the second ground conductor 4b in the first modified digital phase shift circuit aB are shorter than those of the first ground conductor 4a and the second ground conductor 4b in the basic digital phase shift circuit B.

The distance between the first outer line 3a and the first outer line 3a adjacent to each other and the distance between the second outer line 3b and the second outer line 3b adjacent to each other in the digital phase shifter A2 are longer than those in the digital phase shifter A1 according to the first embodiment.

Because the first outer lines 3a and 3a, the second outer lines 3b and 3b, and the first ground conductor 4a and the second ground conductor 4b adjacent to each other in the digital phase shifter A2 do not have direct contact with each other and are spaced farther apart from each other than those in the digital phase shifter A1 according to the first embodiment, the inductance value during the high delay mode can be further increased in the digital phase shifter A2.

Therefore, according to the second embodiment, it is possible to provide the digital phase shifter A2 capable of further increasing the inductance value during the high delay mode. Therefore, according to the second embodiment, it is possible to further increase the difference between the phase shift amount during the high delay mode and the phase shift amount during the low delay mode.

Third Embodiment

Figure 5:
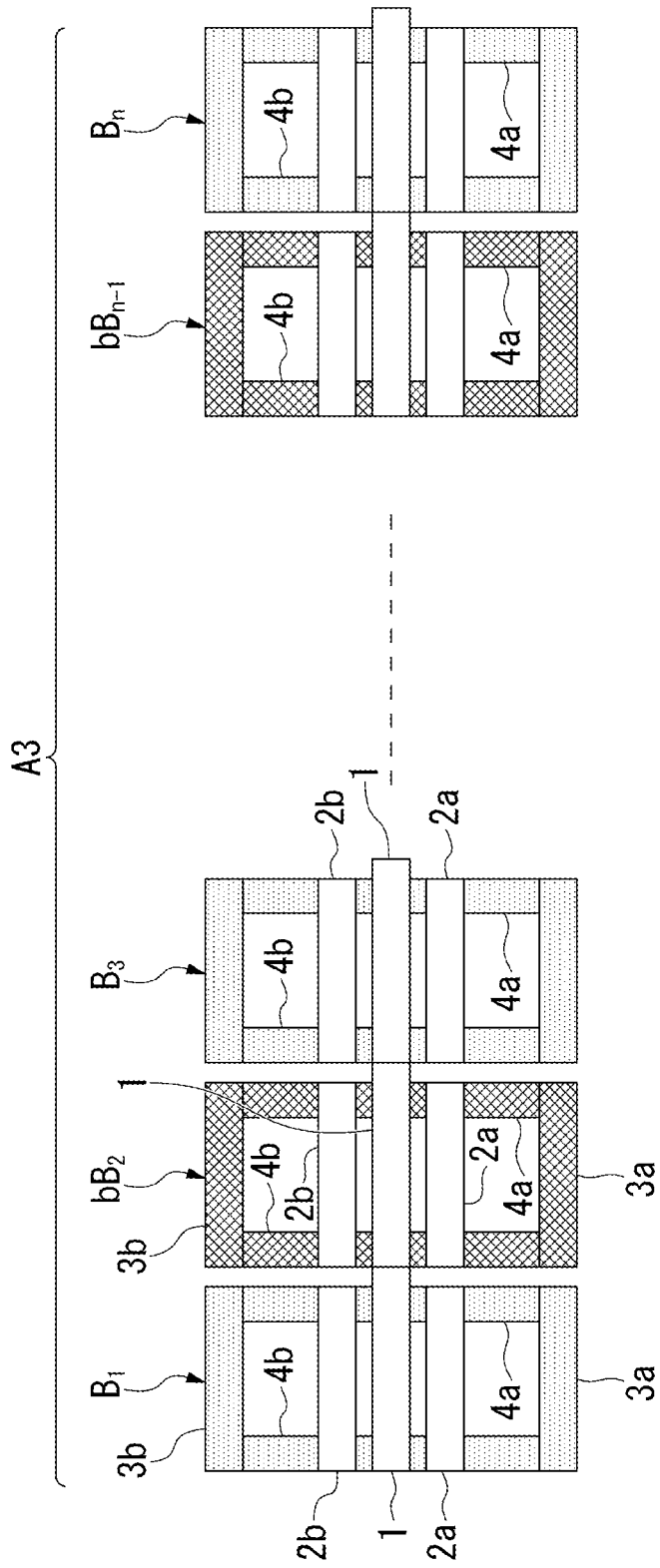
FIG. 5 is a front view showing a configuration of a digital phase shifter A3 according to a third embodiment of the present invention.

Next, a third embodiment of the present invention will be described with reference to FIG. 5. As shown in FIG. 5, in a digital phase shifter A3 according to the third embodiment, a first outer line 3a and a second outer line 3b and a first ground conductor 4a and a second ground conductor 4b are formed in different conductive layers between digital phase shift circuits adjacent to each other.

As described in the first embodiment, the basic digital phase shift circuit B is actually formed as a laminate structure in which a plurality of conductive layers are laminated to sandwich the insulating layer 10. For example, in the basic digital phase shift circuit B, a signal line 1, a first inner line 2a, a second inner line 2b, the first outer line 3a, and the second outer line 3b are formed in a first conductive layer 11, and the first ground conductor 4a and the second ground conductor 4b are formed in the second conductive layer 12 opposing the first conductive layer 11 in a state in which the insulating layer 10 is sandwiched between the first conductive layer 11 and the second conductive layer 12.

On the other hand, in the digital phase shifter A3 according to the third embodiment, in addition to the basic digital phase shift circuit B, a second modified digital phase shift circuit bB having a conductive layer different from the conductive layer of the basic digital phase shift circuit B is adopted, and the basic digital phase shift circuit B and the second modified digital phase shift circuit bB are alternately arranged.

That is, as shown in FIG. 5, in the digital phase shifter A3 according to the third embodiment, the basic digital phase shift circuit B is adopted in a first digital phase shift circuit B1, a third digital phase shift circuit B3, . . . , and an nth digital phase shift circuit Bn. Also, in the digital phase shifter A3, a second modified digital phase shift circuit bB having a conductive layer different from the conductive layer of the basic digital phase shift circuit B is adopted in a second digital phase shift circuit B2, . . . , and an (n−1)th digital phase shift circuit Bn−1.

More specifically, the conductive layer in which the first outer line 3a and the second outer line 3b are formed in the second modified digital phase shift circuit bB is different from the conductive layer in which the first outer line 3a and the second outer line 3b are formed in the basic digital phase shift circuit B. Also, the conductive layer in which the first ground conductor 4a and the second ground conductor 4b are formed in the second modified digital phase shift circuit bB is different from the conductive layer in which the first ground conductor 4a and the second ground conductor 4b are formed in the basic digital phase shift circuit B.

In the digital phase shifter A3 according to the third embodiment, the first ground conductor 4a and the second ground conductor 4b adjacent to each other are formed in a different conductive layer between the digital phase shift circuits adjacent to each other.

In addition, in the digital phase shifter A3 according to the third embodiment, a pair of outer lines (the first outer line 3a and the second outer line 3b) adjacent to each other are also formed in a different conductive layer between the digital phase shift circuits adjacent to each other.

Because the first outer lines 3a and 3a, the second outer lines 3b and 3b, and the first ground conductor 4a and the second ground conductor 4b adjacent to each other in the digital phase shifter A3 do not have direct contact with each other and are spaced farther apart from each other than those in the digital phase shifter A1 according to the first embodiment, the inductance value during the high delay mode can be further increased in the digital phase shifter A3.

Therefore, according to the third embodiment, it is possible to increase the inductance value during the high delay mode as compared with the digital phase shifter A1 according to the first embodiment. Also, as a result, it is possible to increase a difference between the phase shift amount during the high delay mode and the phase shift amount during the low delay mode as compared with the digital phase shifter A1.

Fourth Embodiment

Figure 6:
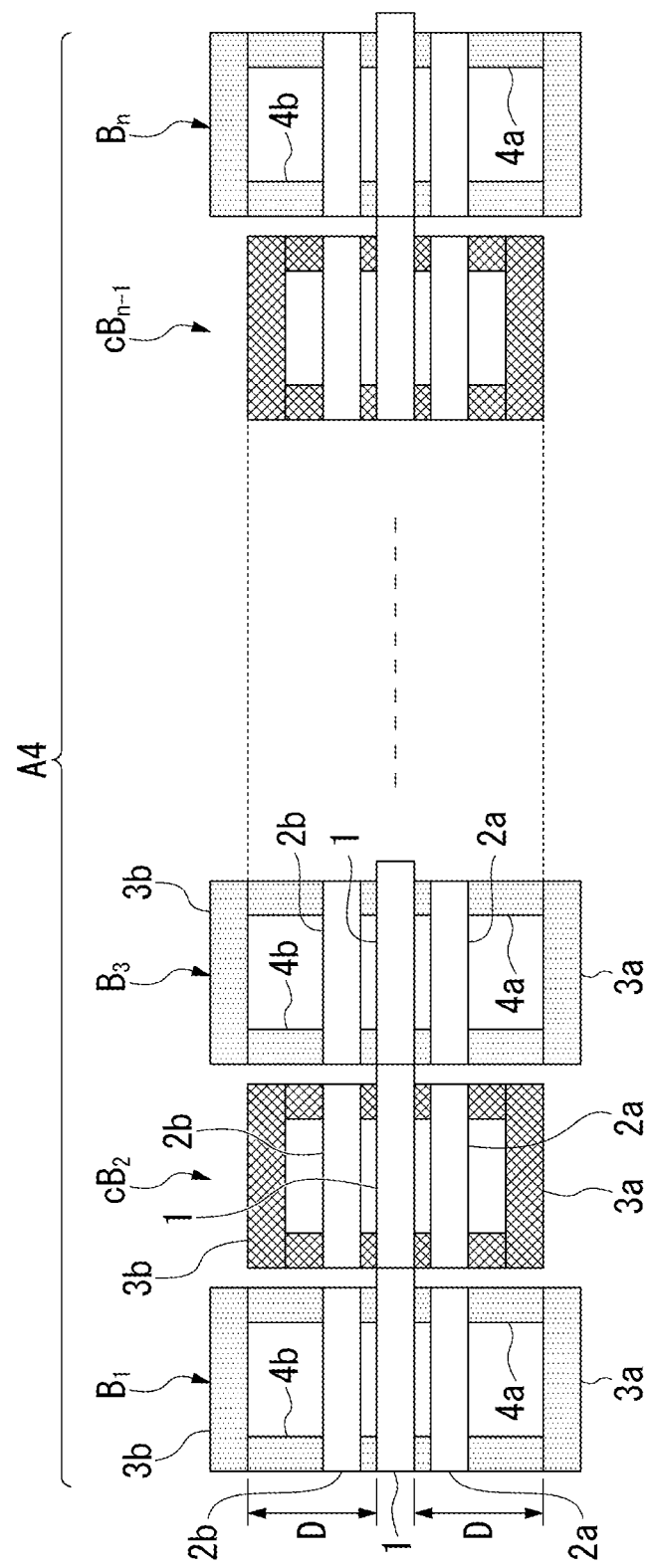
FIG. 6 is a front view showing a configuration of a digital phase shifter A4 according to a fourth embodiment of the present invention.

Next, a fourth embodiment of the present invention will be described with reference to FIG. 6. As shown in FIG. 6, a digital phase shifter A4 according to the fourth embodiment has both a structural feature of the digital phase shifter A2 according to the second embodiment and a structural feature of the digital phase shifter A3 according to the third embodiment.

In addition to a basic digital phase shift circuit B, the digital phase shifter A4 adopts a third modified digital phase shift circuit cB in which distances from a signal line 1 to a first outer line 3a and a second outer line 3b are different and the first outer line 3a, the second outer line 3b, a first ground conductor 4a, and a second ground conductor 4b are formed in conductive layers different from the conductive layers on which the first outer line 3a, the second outer line 3b, the first ground conductor 4a, and the second ground conductor 4b of the basic digital phase shift circuit B are provided. Also, in the digital phase shifter A4, the basic digital phase shift circuit B and the third modified digital phase shift circuit cB are alternately arranged.

That is, as shown in FIG. 6, in the digital phase shifter A4 according to the fourth embodiment, the basic digital phase shift circuit B is adopted in the first digital phase shift circuit B1, the third digital phase shift circuit B3, . . . , and the nth digital phase shift circuit Bn. Also, in the digital phase shifter A4, the third modified digital phase shift circuit cB is adopted in the second digital phase shift circuit B2, . . . , and an (n−1)th digital phase shift circuit Bn−1.

Because the first outer lines 3a and 3a, the second outer lines 3b and 3b, and the first ground conductor 4a and the second ground conductor 4b adjacent to each other in the digital phase shifter A4 do not have direct contact with each other and are spaced farther apart from each other than those in the digital phase shifter A2 according to the second embodiment and the digital phase shifter A3 according to the third embodiment, the inductance value during the high delay mode can be further increased in the digital phase shifter A4.

Therefore, according to the fourth embodiment, it is possible to provide the digital phase shifter A4 capable of further increasing the inductance value during the high delay mode. Thus, according to the fourth embodiment, it is possible to further increase a difference between the phase shift amount during the high delay mode and the phase shift amount during the low delay mode.

Fifth Embodiment

Figure 7:
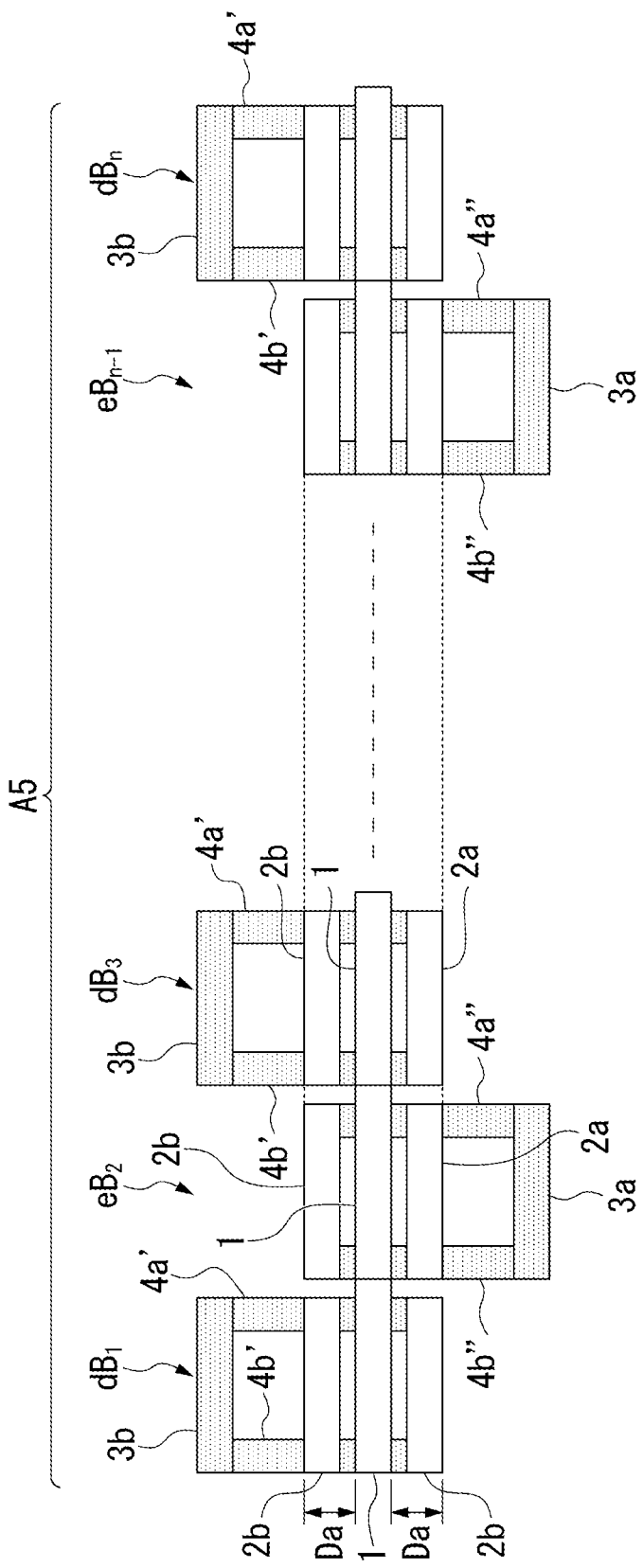
FIG. 7 is a front view showing a configuration of a digital phase shifter A5 according to a fifth embodiment of the present invention.

Next, a fifth embodiment of the present invention will be described with reference to FIG. 7. In a digital phase shifter A5 according to the fifth embodiment, as shown in FIG. 7, one of a first outer line 3a and a second outer line 3b (a pair of outer lines) is deleted such that a positional relationship of a first outer line 3a and a second outer line 3b (a pair of outer lines) with respect to a signal line 1 is reversed between digital phase shift circuits adjacent to each other. Also, the lengths of a first ground conductor 4a and a second ground conductor 4b are set to be shortened in accordance with the deletion of one of the first outer line 3a and the second outer line 3b in the digital phase shifter A5.

As shown in FIG. 7, in the digital phase shifter A5, a fourth modified digital phase shift circuit dB and a fifth modified digital phase shift circuit eB are adopted and the fourth modified digital phase shift circuit dB and the fifth modified digital phase shift circuit eB are alternately arranged. That is, in the digital phase shifter A5, the fourth modified digital phase shift circuit dB is adopted in a first digital phase shift circuit B1, a third digital phase shift circuit B3, . . . , and an nth digital phase shift circuit Bn. Also, in the digital phase shifter A5, the fifth modified digital phase shift circuit eB is adopted in a second digital phase shift circuit B2, . . . , and an (n−1)th digital phase shift circuit Bn−1.

In the fourth modified digital phase shift circuit dB, the first outer line 3a between the first outer line 3a and the second outer line 3b in the basic digital phase shift circuit B is deleted. Also, the fourth modified digital phase shift circuit dB has a first ground conductor 4a' and a second ground conductor 4b' shorter than the first ground conductor 4a and the second ground conductor 4b in the basic digital phase shift circuit B with the deletion of the first outer line 3a. The first ground conductor 4a' and the second ground conductor 4b' extend across an outer edge portion of the second outer line 3b and an outer edge portion of the first inner line 2a as shown in the drawing.

In the fifth modified digital phase shift circuit eB, the second outer line 3b between the first outer line 3a and the second outer line 3b in the basic digital phase shift circuit B is deleted. Also, the fifth modified digital phase shift circuit eB includes a first ground conductor 4a" and a second ground conductor 4b" shorter than the first ground conductor 4a and the second ground conductor 4b in the basic digital phase shift circuit B with the deletion of the second outer line 3b. These first ground conductors 4a" and the second ground conductors 4b" extend across the outer edge portion of the first outer line 3a and the outer edge portion of the second inner line 2b as shown in the drawing.

In this digital phase shifter A5, there are no two first outer lines 3a and 3a adjacent to each other and there are no two second outer lines 3b and 3b adjacent to each other. Also, the first ground conductor 4a and the second ground conductor 4b adjacent to each other are located only between the first inner line 2a and the second inner line 2b. Therefore, the inductance value during the high delay mode can be increased.

Therefore, according to the fifth embodiment, the inductance value during the high delay mode can be increased as compared with the digital phase shifter A2 according to the second embodiment. As a result, according to the fifth embodiment, a difference between the phase shift amount during the high delay mode and the phase shift amount during the low delay mode can be increased as compared with the digital phase shifter A1.

Sixth Embodiment

Figure 8:
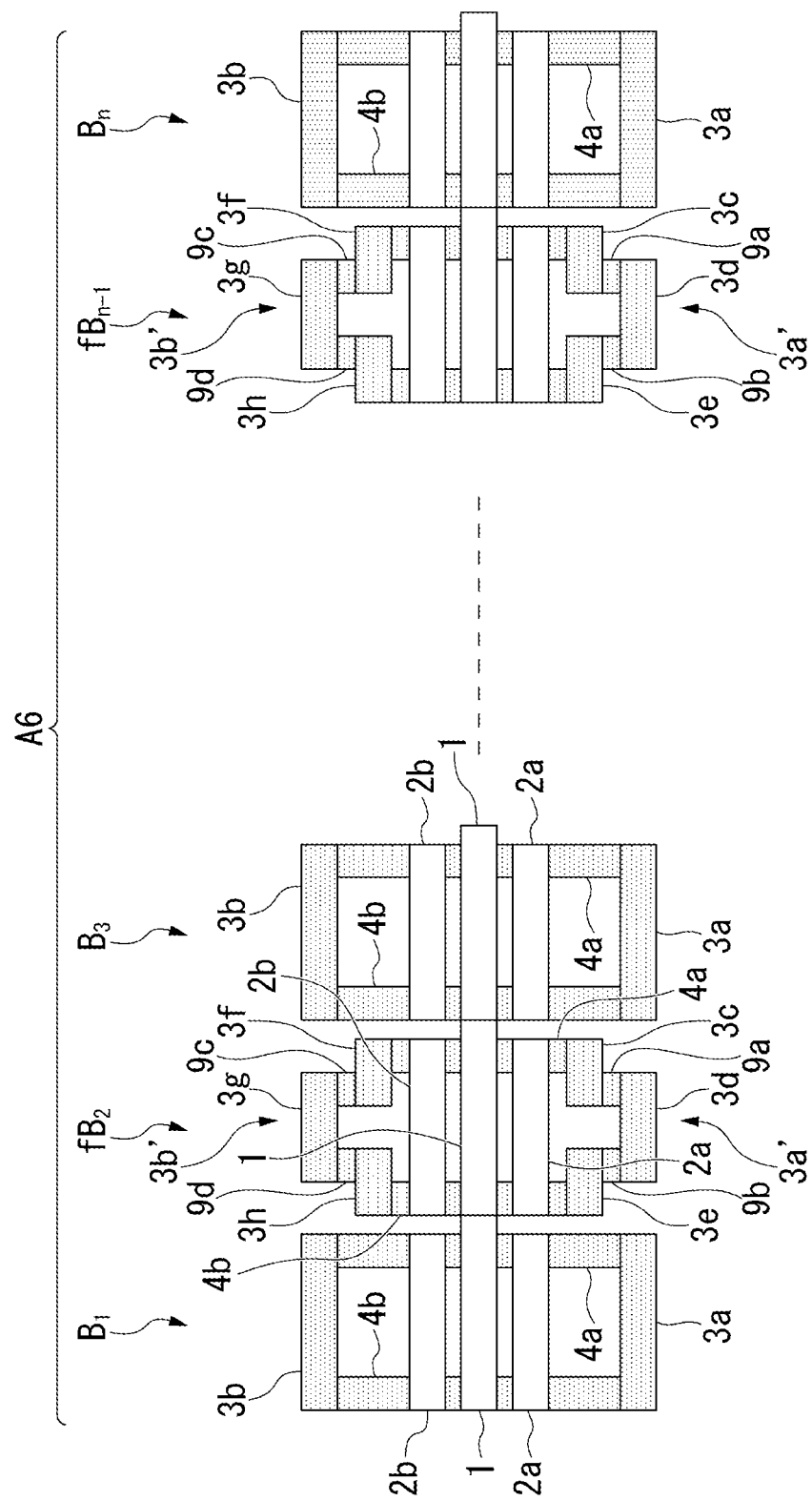
FIG. 8 is a front view showing a configuration of a digital phase shifter A6 according to a sixth embodiment of the present invention.

Next, a sixth embodiment of the present invention will be described with reference to FIG. 8. As shown in FIG. 8, a digital phase shifter A6 according to the sixth embodiment includes a first outer line 3a' and a second outer line 3b' obtained by connecting a plurality of individual lines 3c, 3d, 3e, 3f, 3g, and 3h having different distances from a signal line 1 in one of digital phase shift circuits adjacent to each other.

That is, in the digital phase shifter A6, in addition to the basic digital phase shift circuit A, a sixth modified digital phase shift circuit fB including the first outer line 3a' and the second outer line 3b' in which the plurality of individual lines 3c, 3d, 3e, 3f, 3g, and 3h having different distances from the signal line 1 are connected is adopted. Also, in the digital phase shifter A6, the basic digital phase shift circuit B and the sixth modified digital phase shift circuit fB are alternately arranged.

As shown in FIG. 8, in the digital phase shifter A6 according to the sixth embodiment, the basic digital phase shift circuit B is adopted in a first digital phase shift circuit B1, a third digital phase shift circuit B3, . . . , and an nth digital phase shift circuit Bn. Also, in the digital phase shifter A6, the sixth modified digital phase shift circuit fB is adopted in a second digital phase shift circuit B2, . . . , and an (n-1)th digital phase shift circuit Bn-1.

In the sixth modified digital phase shift circuit fB, the first outer line 3a' is obtained by connecting three individual lines 3c, 3d, and 3e using two connection lines 9a and 9b. The three individual lines 3c, 3d, and 3e are linear band-shaped conductors extending in a direction that is the same as a direction of the signal line 1.

Among the three individual lines 3c, 3d, and 3e, a pair of individual lines 3c and 3e are arranged at the same distance from the signal line 1 as shown in the drawing. Between the pair of individual lines 3c and 3e, the first individual line 3c has the first end connected to the first ground conductor 4a and the second end connected to the first end of the first connection line 9a. Also, the second individual line 3e has the second end connected to the second ground conductor 4b and the first end connected to the first end of the second connection line 9b.

The remaining individual line 3d is arranged farther from the signal line 1 than the pair of individual lines 3c and 3e and has the first end connected to the second end of the first connection line 9a and the second end connected to the second end of the second connection line 9b. The two connection lines 9a and 9b are linear band-shaped conductors extending in the same direction as the first ground conductor 4a and the second ground conductor 4b.

That is, in the first outer line 3a', the three individual lines 3c, 3d, and 3e and the two connection lines 9a and 9b are connected in the order of individual line 3c→connection line 9a→individual line 3d→connection line 9b→individual line 3e.

On the other hand, in the second outer line 3b', the three individual lines 3f, 3g, and 3h are connected using two connection lines 9c and 9d. The three individual lines 3f, 3g, and 3h are linear band-shaped conductors extending in the same direction as the signal line 1.

Among the three individual lines 3f, 3g, and 3h, the pair of individual lines 3f and 3h are arranged at the same distance from the signal line 1 as shown in the drawing. Between the pair of individual lines 3f and 3h, the first individual line 3f has the first end connected to the first ground conductor 4a and the second end connected to the second end of the first connection line 9c. The second individual line 3h has the second end connected to the second ground conductor 4b and the first end connected to the second end of the second connection line 9d.

The remaining individual line 3g is arranged farther from the signal line 1 than the pair of individual lines 3f and 3h and has the first end connected to the first end of the first connection line 9c and the second end connected to the first end of the second connection line 9d. The two connection lines 9c and 9d are linear band-shaped conductors extending in the same direction as the first ground conductor 4a and the second ground conductor 4b.

That is, in the second outer line 3b', the three individual lines 3f, 3g, and 3h and the two connection lines 9c and 9d are connected in the order of individual line 3f connection line 9c→individual line 3g→connection line 9d→individual line 3h.

In the digital phase shifter A6, the distances between the two first outer lines 3a and 3a and the two second outer lines 3b and 3b adjacent to each other are longer than those in the digital phase shifter A1 of the first embodiment. Also, because the first ground conductor 4a and the second ground conductor 4b of the sixth modified digital phase shift circuit fB are also shorter than the first ground conductor 4a and the second ground conductor 4b of the basic digital phase shift circuit B in the first ground conductor 4a and the second ground conductor 4b adjacent to each other, adjacent parts are small as compared with the digital phase shifter A1 of the first embodiment. Therefore, it is possible to increase the inductance value during the high delay mode.

Therefore, according to the sixth embodiment, it is possible to provide the digital phase shifter A6 capable of increasing the inductance value during the high delay mode. Therefore, according to the sixth embodiment, it is possible to further increase a difference between a phase shift amount during the high delay mode and a phase shift amount during the low delay mode.

Seventh Embodiment

Next, a seventh embodiment of the present invention will be described with reference to FIG. 9. A digital phase shifter A7 according to the seventh embodiment can be said to be a modified example of the third embodiment.

As described above, in the digital phase shifter A3 according to the third embodiment, the first outer line 3a and the second outer line 3b are formed in a different conductive layer in addition to a conductive layer in which the first ground conductor 4a and the second ground conductor 4b are formed is different between digital phase shift circuits adjacent to each other. On the other hand, in the digital phase shifter A7 according to the seventh embodiment, only a first ground conductor 4a and a second ground conductor 4b are formed in a different conductive layer between digital phase shift circuits adjacent to each other.

Figure 9:
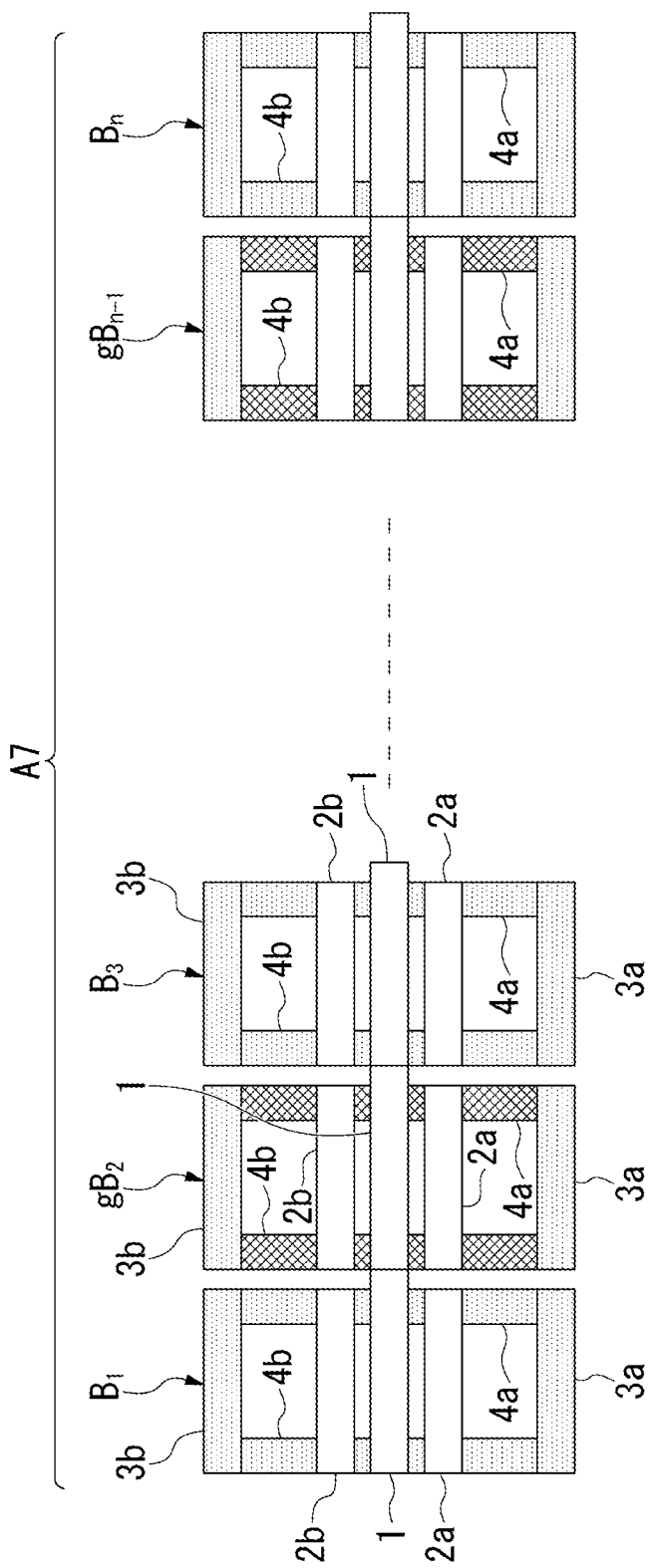
FIG. 9 is a front view showing a configuration of a digital phase shifter A7 according to a seventh embodiment of the present invention.

As shown in FIG. 9, in the digital phase shifter A7, a basic digital phase shift circuit B and a seventh modified digital phase shift circuit gB are adopted and the basic digital phase shift circuit B and the seventh modified digital phase shift circuit gB are alternately arranged. That is, in the digital phase shifter A7, the basic digital phase shift circuit B is adopted in a first digital phase shift circuit B1, a third digital phase shift circuit B3, ..., and an nth digital phase shift circuit Bn. Also, in the digital phase shifter A7, the seventh modified digital phase shift circuit gB is adopted in a second digital phase shift circuit B2, ..., and an (n−1)th digital phase shift circuit Bn−1.

In the seventh modified digital phase-shift circuit gB, a signal line 1, a first inner line 2a, a second inner line 2b, a first outer line 3a, and a second outer line 3b are formed in a first conductive layer 11. Also, in the seventh modified digital phase shift circuit gB, when the first ground conductor 4a and the second ground conductor 4b of the basic digital phase shift circuit B are formed in a second conductive layer 12 opposing the first conductive layer 11 in a state in which the insulating layer 10 is sandwiched between the first conductive layer 11 and the second conductive layer 12, the first ground conductor 4a and the second ground conductor 4b are formed in a conductive layer different from the conductive layer 12.

According to the digital phase shifter A7 of the seventh embodiment, because the first ground conductor 4a and the second ground conductor 4b adjacent to each other are formed in a different conductive layer, an inductance value during the high delay mode can be further increased as in the digital phase shifter A3 of the third embodiment.

Therefore, according to the seventh embodiment, a difference between a phase shift amount during a high delay mode and a phase shift amount during a low delay mode can be increased as compared with the digital phase shifter A1 of the first embodiment.

REFERENCE SIGNS LIST

A1 to A7: Digital phase shifter
B, B1 to Bn: Basic digital phase shift circuit
aB, aB1 to aBn−1: First modified digital phase shift circuit
bB, bB1 to bBn−1: Second modified digital phase shift circuit
cB, cB2 to cBn−1: Third modified digital phase shift circuit
dB, dB2 to dBn−1: Fourth modified digital phase shift circuit
eB, eB2 to eBn−1: Fifth modified digital phase shift circuit
fB, fB2 to fBn−1: Sixth modified digital phase shift circuit
gB, gB2 to gBn−1: Seventh modified digital phase shift circuit
1: Signal line
2a: First inner line
2b: Second inner line
3a: First outer line
3b: Second outer line
4a: First ground conductor
4b: Second ground conductor
5: Capacitor
6a: First connection conductor
6b: Second connection conductor
6c: Third connection conductor
6d: Fourth connection conductor
6e: Fifth connection conductor
6f: Sixth connection conductor
6g: Seventh connection conductor
7a: First electronic switch
7b: Second electronic switch
7c: Third electronic switch
7d: Fourth electronic switch (electronic switch for capacitor)
8: Switch controller

The invention claimed is:

1. A digital phase shifter in which a plurality of digital phase shift circuits are connected in cascade, one of the digital phase shift circuits including at least a signal line, a pair of inner lines provided at both sides of the signal line, a pair of outer lines provided outside of the pair of inner lines, a first ground conductor connected to each of first ends of the pair of inner lines and the pair of outer lines, a second ground conductor connected to each of second ends of the pair of outer lines, and a pair of electronic switches provided between each of the second ends of the pair of inner lines and the second ground conductor,
wherein the pair of outer lines adjacent to each other are separated between the digital phase shift circuits adjacent to each other and the first ground conductor and the second ground conductor adjacent to each other are separated between the digital phase shift circuits adjacent to each other.

2. The digital phase shifter according to claim 1, wherein the first ground conductor and the second ground conductor adjacent to each other are formed on a different conductive layer between the digital phase shift circuits adjacent to each other.

3. The digital phase shifter according to claim 2, wherein the pair of outer lines adjacent to each other are also formed on a different conductive layer between the digital phase shift circuits adjacent to each other.

4. The digital phase shifter according to claim 1, wherein distances from the signal line to the pair of outer lines are different between the digital phase shift circuits adjacent to each other.

5. The digital phase shifter according to claim 1, wherein one of the pair of outer lines is deleted such that a positional relationship of the pair of outer lines with respect to the signal line is reversed between the digital phase shift circuits adjacent to each other.

6. The digital phase shifter according to claim 1, wherein one of the digital phase shift circuits adjacent to each other includes the pair of outer lines obtained by connecting a plurality of individual lines having different distances from the signal line.

7. The digital phase shifter according to claim 1, wherein the digital phase shift circuit includes a capacitor having an upper electrode connected to the signal line and a lower electrode connected to at least one of the first ground conductor and the second ground conductor.

8. The digital phase shifter according to claim 7, wherein the digital phase shift circuit further includes an electronic switch for a capacitor between the lower electrode of the capacitor and at least one of the first ground conductor and the second ground conductor.

* * * * *